United States Patent [19]

Fujioka et al.

[11] Patent Number: 4,580,522

[45] Date of Patent: Apr. 8, 1986

[54] ROTARY SUBSTRATE HOLDER OF MOLECULAR BEAM EPITAXY APPARATUS

[75] Inventors: Kazumasa Fujioka, Ibaraki; Sumio Okuno, Kudamatsu; Muneo Mizumoto, Tsuchiura; Hideaki Kamohara, Ibaraki; Shinjiro Ueda, Abiko; Takao Kuroda, Kokubunji; Sumio Yamaguchi, Tokyo; Naoyuki Tamura, Kudamatsu, all of Japan

[73] Assignee: Hitachi, Ltd., Tokyo, Japan

[21] Appl. No.: 706,184

[22] Filed: Feb. 27, 1985

[30] Foreign Application Priority Data

Feb. 27, 1984 [JP] Japan .................. 59-34209

[51] Int. Cl.[4] ........................................... B05C 13/00
[52] U.S. Cl. ..................... 118/500; 118/725; 118/730; 156/DIG. 103
[58] Field of Search .............. 118/500, 728, 729, 730, 118/725, 733, 715; 427/255.5; 156/DIG. 103, 610, 611, 613, 614; 269/903, 57

[56] References Cited

U.S. PATENT DOCUMENTS

| | | | |
|---|---|---|---|
| 2,398,382 | 4/1946 | Lyon | 118/725 X |
| 3,424,628 | 1/1969 | Winings | 427/255.5 X |
| 3,751,310 | 8/1973 | Cho | 156/DIG. 103 |
| 3,824,955 | 7/1974 | Marks et al. | 118/500 |
| 4,181,544 | 1/1980 | Cho | 156/614 |
| 4,201,152 | 5/1980 | Luscher | 118/500 X |
| 4,207,836 | 6/1980 | Nonaka | 118/730 X |
| 4,514,250 | 4/1985 | Hwang | 156/DIG. 103 |

FOREIGN PATENT DOCUMENTS 100206  2/1984  European Pat. Off. ............ 118/725

OTHER PUBLICATIONS

Bauer, "Obtaining an Oxide-Free Interface in VIA Connections", *IBM Tech. Disclosure Bulletin*, vol. 20, No. 2, Jul. 1977, pp. 574-576.

*Primary Examiner*—Bernard F. Plantz
*Attorney, Agent, or Firm*—Antonelli, Terry & Wands

[57] ABSTRACT

A rotary substrate holder of a molecular beam epitaxy apparatus including leads-cum-posts serving both as leads for passing a current to a heater for heating a substrate and as posts for supporting the heater. By this arrangement, heat transferred from the heater to a bearing disposed in the vicinity of the heater is minimized in amount, thereby prolonging the service life of the holder and minimizing a heat loss thereof.

4 Claims, 11 Drawing Figures

ROTARY SUBSTRATE HOLDER OF MOLECULAR BEAM EPITAXY APPARATUS

BACKGROUND OF THE INVENTION (1) Field of the Invention

This invention relates to a rotary substrate holder of a molecular beam epitaxy apparatus.

(2) Description of the Prior Art

In one type of rotary substrate holder of a molecular beam epitaxy apparatus known in the art, a heater base for mounting a heater thereon is supported by a stationary shaft through posts, and leads for passing a current to the heater extend through the stationary shaft to the outside of the holder. This type of rotary substrate holder of the prior art has suffered a disadvantage that, since the heat generated by the heater is transferred via the heater base and the posts of high heat transfer rate to the stationary shaft and further heat is generated within the stationary shaft by the resistance of the leads, bearings mounted on the stationary shaft might be heated and have their temperature raised, thereby causing a reduction in the reliability of the bearings and shortening the service life of the holder. Also, the holder might have a high termal loss. This type of rotary substrate holder of a molecular beam epitaxy apparatus is disclosed in U.S. Pat. No. 4,201,152, for example.

SUMMARY OF THE INVENTION (1) Object of the Invention

This invention has as its object the provision of a rotary substrate holder of a molecular beam epitaxy apparatus capable of suppressing a rise in the temperature of the bearing sections to improve the reliability of the apparatus and, at the same time, of achieving a reduction in a thermal loss of the holder.

(2) Statement of the Invention

The outstanding characteristic of the invention enabling the aforesaid object to be accomplished is that the leads for passing a current to the heater for heating the substrate are combined into the posts for supporting the heater to provide leads-cum-posts, whereby the amount of heat transferred to the bearings located near the heater can be reduced to prolong the service life of the holder and avoid a thermal loss thereof.

DESCRIPTION OF THE PREFERRED EMBODIMENTS

Preferred embodiments of the invention will now be described by referring to the accompanying drawings.

Figure 1:
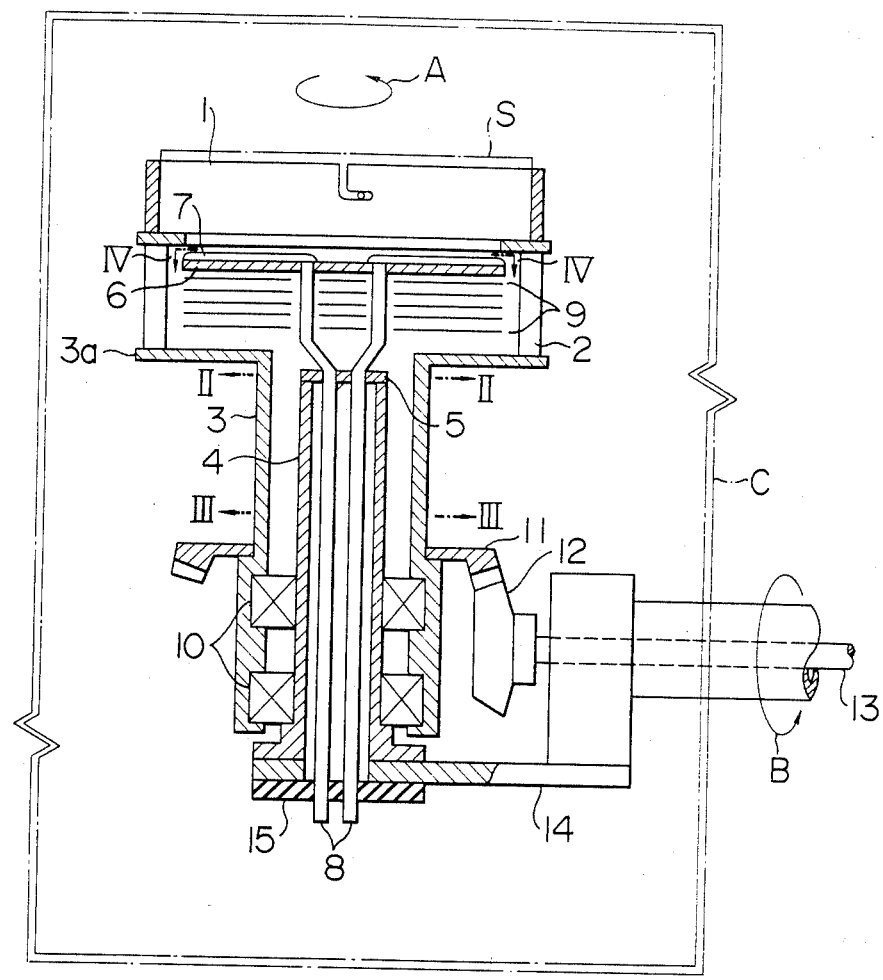
FIG. 1 is a vertical sectional view of the rotary substrate holder of a molecular beam epitaxy apparatus comprising one embodiment of the invention.
Figure 2:
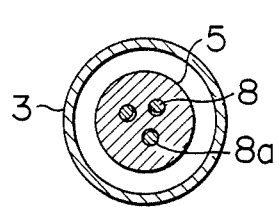
FIGS. 2 and 3 are transverse sectional views taken along the lines II—II and III—III, respectively, in FIG. 1.
Figure 3:
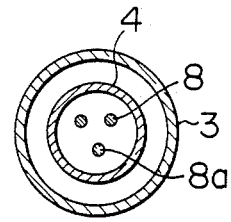
Figure 4:
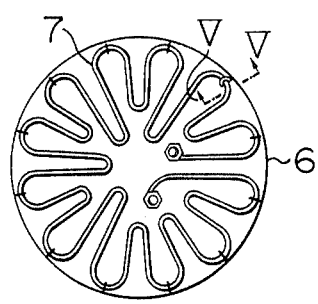
FIG. 4 is a plan view as seen in the direction of arrows IV—IV in FIG. 1.
Figure 5:
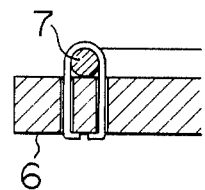
FIG. 5 is a sectional view as seen in the direction of arrows V—V in FIG. 4.

In FIGS. 1-5, there is shown one embodiment of the rotary substrate holder of a molecular beam epitaxy apparatus in conformity with the invention. The holder located in a vacuum vessel C comprises a susceptor S including a substrate of GaAs adhered to a base of molybdenum by indium. The susceptor is held in place by a holding frame (formed of tantalum) 1 which is supported by a plurality of posts (formed of molybdenum) 2 connected to a flange 3a of a rotary shaft (formed of stainless steel) 3 of substantially cylindrical configuration. A terminal plate (formed of pyrolytic boron nitride) 5 is secured to a portion of a stationary shaft (formed of stainless steel) 4 of substantially cylindrical configuration which is near a heater 7 mounted on a heater base 6 (formed of pyrolytic boron nitride). Leads-cum-posts (formed of tantalum and having a diameter of 3 mm) 8 for supporting the heater base 6 and passing a current to the heater 7 are connected to the heater base 6. According to the invention, an auxiliary post for supporting the heater base 6 without passing a current may be provided in addition to the leads-cum-posts 8. In this embodiment, an auxiliary post 8a is provided as shown in FIGS. 2 and 3. The heater 7 is mounted on the heater base 6 in a radial manner as shown in FIGS. 4 and 5. A radiation shield plate assembly (including ten plates formed of tantalum and having a thickness of 0.2 mm) 9 is located below the heater base 6 and capable of achieving the radiation shielding effect of substantially $1/(n+1)$ (n is the number of plates). The radiation shield plate assembly 9 performs the function of preventing the heat generated by the heater 7 from being transferred by radiation to the rotary shaft 3 and stationary shaft 4 and raising the temperature of bearings (plated with silver) 10. The bearings 10 which journal the rotary shaft 3 for rotation about the stationary shaft 4 should be of the type suitable for use in an evacuated space. Secured to the rotary shaft 3 is a bevel gear (formed of stainless steel) 11 which is maintained in meshing engagement with another bevel gear (formed of stainless steel) 12 to which a motive force is transmitted through a shaft 13 from a drive source, not shown located outside the holder. The stationary shaft 4 is connected to a holding plate 14 to which a terminal plate 15 (formed of insulating material) is attached. The leads-cum-posts 8 extending through the stationary shaft 4 which is hollow are secured to the terminal plate 15 at their ends remote from the heater 7 and extend outwardly of the holder. The terminal plate 5 located near the heater 7 is formed with openings of a diameter greater than that of the leads-cum-posts 8, so that the leads-cum-posts 8 merely extend through the terminal plate 5 without being supported by it. The holder of the aforesaid construction is provided with drive means, not shown, for rotating the holding frame 1 in the direction of an arrow A shown in FIG. 1 when an epitaxial growth takes place, and drive means, not shown, for turning the rotary substrate holder as a whole in the direction of an arrow B shown in FIG. 1 to a position necessary for replacing the susceptor S by a new one. The temperature of the susceptor S greatly influences the epitaxial growth, so that it is necessary to keep the susceptor S as a whole in a uniform temperature condition. The preferred temperatures include the range between 600° and 800° C. in a GaAs system and about 1000° C. in a Si system. Heating is effected by radiation by means of the heater 7 located immediately below the substrate holding frame 1.

In the rotary substrate holder of the aforesaid construction, heat is transferred from the heater 7 and heater base 6 of elevated temperature through the leads-cum-posts 8 to the terminal plate 15 and holding plate 14 and through the stationary shaft 4 to the bearings 10. Since the leads-cum-posts 8 have a large length, a resistance of high magnitude is offered to the transfer of heat by the leads-cum-posts 8, with a result that the temperature of the terminal plate 15 is sufficiently low to avoid any trouble that might be caused by elevated temperature. The leads-cum-posts 8 have a diameter greater than that of ordinary leads (which is about 0.5 mm), so that generation of heat by the leads-cum-posts 8 can be neglected. Thus, the trouble that the hollow stationary shaft 4 might be heated from inside can be avoided, and the heat transferred to be bearings 10 is small in amount, so that the bearings 10 can be kept at a very low temperature. As a result, the reliability of the holder is improved and the service life thereof is prolonged. When the susceptor S was heated to a temperature of 600° C., the temperature of the bearings of a rotary substrate holder of the prior art rose to 300° C. However, it was ascertained that the temperature of the bearings rose only to 200° C. in the rotary substrate holder according to the invention under the same condition.

To support the leads-cum-posts 8 with increased firmness, spacer members of insulating material may be inserted in the hollow stationary shaft 4 to support the leads-cum-posts 8. In this case, the amount of heat transferred to the stationary shaft 4 can be reduced to a level that can be neglected for all practical purposes by bringing the leads-cum-posts 8 into point-to-point contact with the spacer members.

Figure 6:
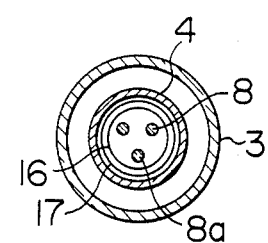
FIG. 6 is a transverse sectional view of another constructional form of leads-cum-posts, taken along the line III—III in FIG. 1.

FIG. 6 shows another constructional form of leads-cum-posts according to the invention. In this constructional form, two radiation shield plates 16 and 17 extend vertically through the interior of the stationary shaft 4 and are interposed between a wall of the shaft 4 and the leads-cum-posts 8. By this arrangement, transfer of heat from the leads-cum-posts 8 to the stationary shaft 4 can be further reduced in amount.

Figure 7:
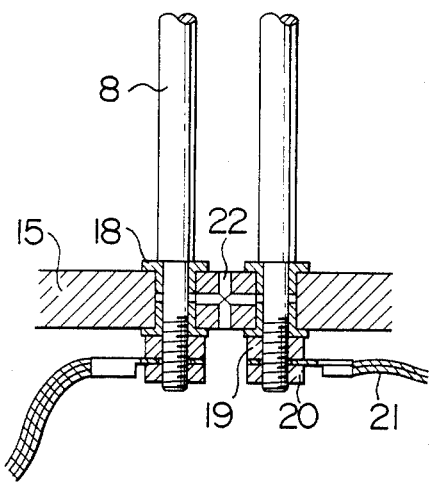
FIG. 7 is a sectional view of a modified form of the terminal plate which supports the leads-cum-posts.

FIG. 7 shows in a cross section a modified form of the terminal plate 15 which supports the leads-cum-posts 8. This structure enables the leads-cum-posts 8 to be positively and firmly supported. More specifically, a bush 18 is fitted in an opening formed in the terminal plate 15 for receiving each lead-cum-post 8. The bushes 18 are formed of insulating material where the terminal plate 15 is formed of conductive material. Leads 21 are secured to the leads-cum-posts 8 by means of nuts 19 and 20. To avoid air being trapped in the bushes 18, air vents 22 are formed in the terminal plate 15.

Figure 8:
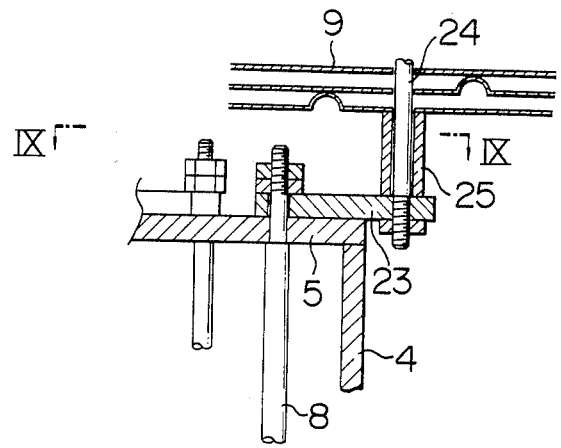
FIG. 8 is a sectional view of a modified form of a portion of the leads-cum-posts for passing a current to the heater.
Figure 9:
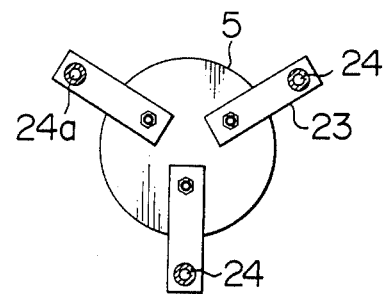
FIG. 9 is a plan view as seen in the direction of arrows IX—IX in FIG. 8.

FIG. 8 shows in a cross section a modified form of a portion of the leads-cum-posts for passing a current to the heater, and FIG. 9 is a plan view as seen in the direction of arrows IX—IX in FIG. 8. This constructional form has increased precision in structure as viewed axially. A current is passed from the leads-cum-posts 8 to the heater 7 via lead members 23 and leads 24 which each has an insulating bush 25 fitted thereto. A member 24a is not concerned with passing a current but function as auxiliary post.

Figure 10:
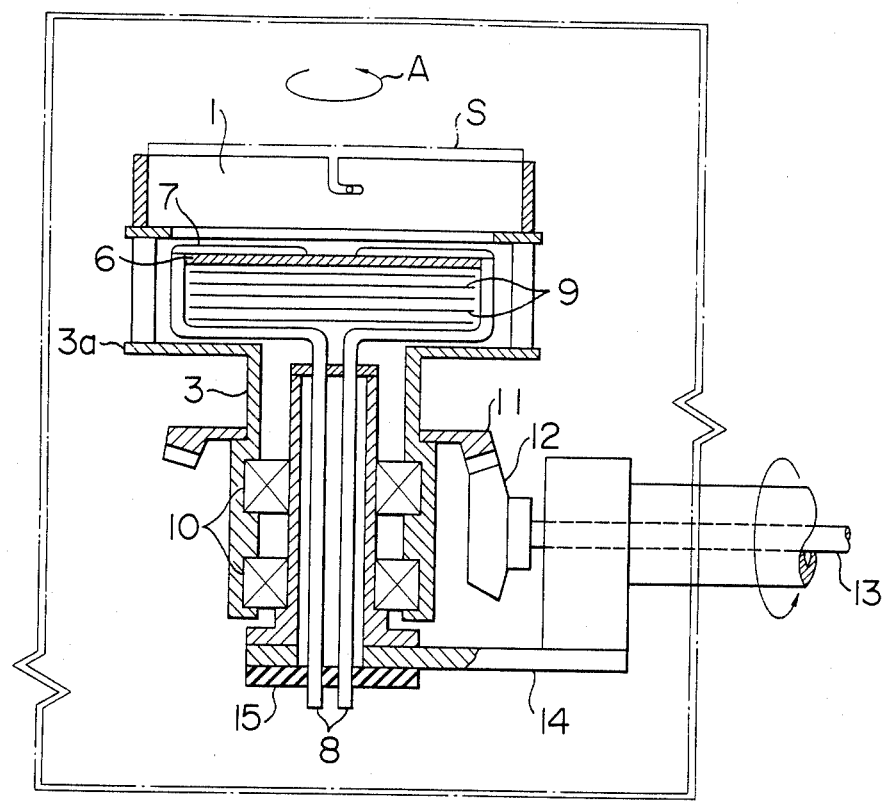
FIG. 10 is a vertical sectional view of the rotary substrate holder of a molecular beam epitaxy apparatus comprising another embodiment.

FIG. 10 shows in a vertical sectional view another embodiment of the rotary substrate holder in conformity with the invention, in which leads-cum-posts 8 support the heater base 6 at a peripheral portion of the latter. In this embodiment, the need to form openings in the radiation shield plate assembly 9 is eliminated, so that improved results can be achieved in shielding radiation and the radiation shield plates can be assembled with great ease.

Figure 11:
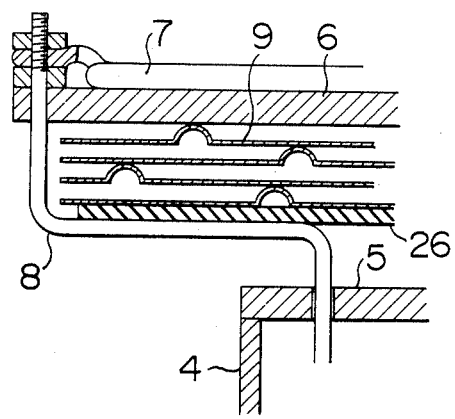
FIG. 11 is a fragmentary sectional view, on an enlarged scale, of the holder shown in FIG. 10.

FIG. 11 shows an enlarged and fragmentary sectional view of the holder shown in FIG. 10. The heater base 6 and the heater 7 are secured to the leads-cum-posts 8. Each plate of the radiation shield plate assembly 9 is provided with one or more projections which serve as spacers to locate the plates with suitable gaps therebetween. An insulator plate 26 is inserted between the leads-cum-posts 8 and the radiation shield plate assembly 9 to electrically insulate them from each other.

From the foregoing description, it will be appreciated that, in the embodiments of the rotary substrate holder of a molecular beam epitaxy apparatus in conformity with the invention, the leads for passing a current to the heater serve concurrently as posts for supporting the heater base. This constitutive feature of the invention improves the reliability of the bearings and prolongs the service life of the holder while minimizing a thermal loss of the latter.

What is claimed is:

1. A rotary substrate holder of a molecular beam epitaxy apparatus for holding in place a substrate for achieving a molecular beam epitaxial growth, comprising:

a heater for heating the substrate;
 a rotary shaft for rotating the substrate;
 a stationary shaft arranged coaxially with the rotary shaft; and
 drive means for driving said rotary shaft for rotation;
wherein the improvement comprises:
 leads-cum-posts extending through an interior of said stationary shaft which is located inside said rotary shaft and serving both as leads for passing a current to the heater and as posts for supporting the heater; and
 means for holding said leads-cum-posts in position.

2. A rotary substrate holder of a molecular beam epitaxy apparatus as claimed in claim 1, wherein said leads-cum-posts extending through said stationary shaft are supported by a terminal plate secured to an end portion of said stationary shaft which end portion is remote from the heater.

3. A rotary substrate holder of a molecular beam epitaxy apparatus as claimed in claim 2, further comprising an auxiliary post merely serving to support said heater, said auxiliary post extending through the interior of said stationary shaft and supported by said terminal plate.

4. A rotary substrate holder of a molecular beam epitaxy apparatus as claimed in claim 1, further comprising radiation shield plates mounted between said leads-cum-posts and a wall of the stationary shaft.

* * * * *